United States Patent
Allendorf et al.

(10) Patent No.: US 11,940,576 B1
(45) Date of Patent: Mar. 26, 2024

(54) MULTIAXIS SENSING SYSTEM FOR DETECTION OF AIRBORNE MOLECULES AND RADIONUCLIDES

(71) Applicant: National Technology & Engineering Solutions of Sandia, LLC, Albuquerque, NM (US)

(72) Inventors: Mark D. Allendorf, Pleasanton, CA (US); Fred Patrick Doty, Livermore, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 417 days.

(21) Appl. No.: 17/362,212

(22) Filed: Jun. 29, 2021

(51) Int. Cl.
| | |
|---|---|
| *G01T 1/20* | (2006.01) |
| *B01J 20/22* | (2006.01) |
| *B81B 7/00* | (2006.01) |
| *G01T 1/16* | (2006.01) |
| *G01T 1/167* | (2006.01) |
| *G01T 7/02* | (2006.01) |

(52) U.S. Cl.
CPC ......... *G01T 1/20184* (2020.05); *B01J 20/226* (2013.01); *B81B 7/0038* (2013.01); *B81B 7/0077* (2013.01); *G01T 1/167* (2013.01); *G01T 7/02* (2013.01); *B81B 2201/0214* (2013.01); *B81B 2201/036* (2013.01)

(58) Field of Classification Search
CPC .... B01J 20/226; B81B 7/0038; B81B 7/0077; B81B 2201/0214; B81B 2201/036; G01T 1/167; G01T 1/20184; G01T 7/02
See application file for complete search history.

(56) References Cited

U.S. PATENT DOCUMENTS

| | | | |
|---|---|---|---|
| 7,985,868 B1 * | 7/2011 | Bauer | C09K 11/06 |
| | | | 549/534 |
| 2011/0108738 A1 * | 5/2011 | Doty | C09K 11/06 |
| | | | 252/301.33 |
| 2017/0362097 A1 * | 12/2017 | Mertz | C02F 9/00 |

(Continued)

OTHER PUBLICATIONS

Doty, et al., "Scintillating Metal-Organic Frameworks: A New Class of Radiation Detection Materials", In Advanced Materials, vol. 21, 2009, pp. 95-101.

(Continued)

*Primary Examiner* — Mark R Gaworecki
(74) *Attorney, Agent, or Firm* — Madelynne J. Farber; Samantha Updegraff

(57) ABSTRACT

Various technologies presented herein relate to a method and equipment for detecting both airborne radioisotope and molecular effluent gases. Multi-Axis Sensing can be conducted by utilizing a pressurized MOF sorbent, such as a scintillating Metal-Organic Frameworks (S-MOFs). These MOFs are crystalline nanoporous materials that have synthetic versatility that allow adjustment of pore size, chemical environment, and luminescence properties. A method for detecting an analyte in a fluid sample is provided that comprises: loading a sorbent with a sample fluid, wherein the sorbent comprises a MOF material; pressurizing the sample fluid to increase the fluid in the sorbent thereby making a pressurized sorbent; and detecting ionizing radiation or a chemical property of the analyte in the pressurized sorbent.

20 Claims, 13 Drawing Sheets

(56) References Cited

U.S. PATENT DOCUMENTS

2018/0153796 A1* 6/2018 Lin ................... A61K 31/405
2021/0262970 A1* 8/2021 Mirica ................ C07F 15/04

OTHER PUBLICATIONS

Kreno, et al., "Metal-Organic Framework Materials as Chemical Sensors", In Chemical Reviews, American Chemical Society, vol. 112, 2012, pp. 1105-1125.

Parkes, et al., "Screening Metal-Organic Frameworks for Selective Noble Gas Adsorption in Air: Effect of Pore Size and Framework Topology", In Phys. Chem. Chem. Phys., RSC Publishing, vol. 15, 2013, pp. 9093-9106.

Perry IV, et al., "Connecting Structure With Function in Metal-Organic Frameworks to Design Novel Photo- and Radioluminescent Materials, In Journal of Materials Chemistry", vol. 22, 2012, pp. 10235-10248.

Van Heest, et al., "Identification of Metal-Organic Framework Materials for Adsorption Separation of Rare Gases: Applicability of Ideal Adsorbed Solution Theory (IAST) and Effects of Inaccessible Framework Regions", In The Journal of Physical Chemistry C, American Chemical Society, vol. 116, 2012, pp. 13183-13195.

Wang, et al., "Get the Light Out: Nanscaling MOFs for Luminescence Sensing and Optical Applications", In ChemComm, Royal Society of Chemistry, vol. 55, 2019, pp. 4647-4650.

Allendorf, et al., "Exploiting the Tailorable Nanoporosity of Metal-Organic Frameworks for In-Situ Identification of Radioisotopes" (Abstract), Conference: SnT2019 held Jun. 24-28, 2019 in Vienna, Austria.

Allendorf, et al., [Presentation slides] "Exploiting the Tailorable Nanoporosity of Metal-Organic Frameworks for In-Situ Identification of Radioisotopes" Conference: SnT2019 held Jun. 24-28, 2019 in Vienna, Austria.

* cited by examiner

MULTIAXIS SENSING SYSTEM FOR DETECTION OF AIRBORNE MOLECULES AND RADIONUCLIDES

STATEMENT OF GOVERNMENTAL INTEREST

This invention was made with Government support under Contract No. DE-NA0003525 awarded by the United States Department of Energy/National Nuclear Security Administration. The Government has certain rights in the invention.

FIELD

The technology disclosed herein relates to sensing of airborne molecules and radionuclides.

BACKGROUND

For environmental and security purposes, diagnostic tools are needed that can detect gas-phase effluents, such as noble gas radioisotopes, present in medical isotope production and nuclear fuel reprocessing. This may be needed for leak detection or confirmation of nuclear activity. The noble gases krypton and xenon are the two most abundant products of fission, due to their stability. Any technology using fission emits these isotopes. This includes medical isotope production, nuclear power generation, and nuclear weapons production and testing.

It is important to note that noble gas radioisotopes are qualitatively different from other airborne radioisotopes because they are not reactive. This means they are difficult to contain when generated, and difficult to capture for detection. Airborne radioisotopes of other elements tend to get bound in particles and are easily captured by filtration in commercial continuous air monitors (CAMs). These commercial systems are useless for noble gas monitoring because the gases do not accumulate in the filter media.

While current technology allows for capture of small volume samples and analysis in a lab at a later time, the current technology in the field has shortcomings in both sensitivity, timeliness, and lacks ability to monitor or detect multiple properties of an analyte simultaneously.

Metal-organic frameworks (MOFs) are crystalline materials with a nanoporous supramolecular structure consisting of metal ions connected by organic ligands (referred to as linkers). Their tailorable porosity, ease of synthesis, and ultra-high surface areas, combined with a broad choice of suitable building blocks, make them promising materials for numerous applications.

A scintillator is a material that when bombarded with high energy radiation, e.g., gamma rays or X-rays produces a response in the visible spectrum, a luminescent (fluorescent or phosphorescent) response. The phenomenon of luminescence is a useful tool for application in materials analysis. Emission of the photons from luminescence can be detected, and based thereon, particular materials characteristic to that emission can be determined to be present. Direct observation of ionizing radiation is also an available technique for materials analysis.

SUMMARY

The following is a brief summary of subject matter that is described in greater detail herein. This summary is not intended to be limiting as to the scope of the claims.

Disclosed herein is a method and equipment for detecting both airborne radioisotope and molecular effluent gases. This method is referred to herein as Multi-Axis Sensing (MAS). MAS is enabled by a MOF sorbent, such as a scintillating Metal-Organic Frameworks (S-MOFs). These MOFs are crystalline nanoporous materials that have synthetic versatility that allow adjustment of pore size, chemical environment, and luminescence properties for particular desired applications. The sensitivity of our approach may be as much as $1\times10^4$ times that of CAMs.

Molecules or radioisotopes generating scintillation events as a result of interaction with beta and gamma particles or other sensed events can be detected and analyzed contemporaneously using a MOF that is pressurized to load it with high quantities of airborne particles.

In an embodiment, the MOF can be sandwiched within a phoswitch detector structure. In an embodiment, pressurized air flowing through the sorbent bed will load the S-MOF to capacity, increasing detected signals by as much as two orders of magnitude. Real-time detection/identification of radioisotopes at ppb levels are feasible with this design, without using large-volume air separation techniques.

In an embodiment, an apparatus for analyte detection comprises: a pressure cell including a sorbent, the sorbent comprising a metal-organic-framework (MOF) material; a pump coupled to the pressure cell configured to pressurize the sorbent with a fluid containing an analyte; a sensor configured for detection of the analyte in the sorbent by detecting gamma, beta, or gamma and beta particles; and a computing device configured to process data received from the sensor and compile multiple sensed properties to produce a signature set of data for the analyte.

In an embodiment, a method for detecting an analyte in a fluid sample includes the steps of: loading a sorbent with a sample fluid, wherein the sorbent comprises a MOF material; pressurizing the sample fluid to increase the sample fluid in the sorbent thereby making a pressurized sorbent; and detecting more than one of ionizing radiation or a chemical property of the analyte in the pressurized sorbent.

The above presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
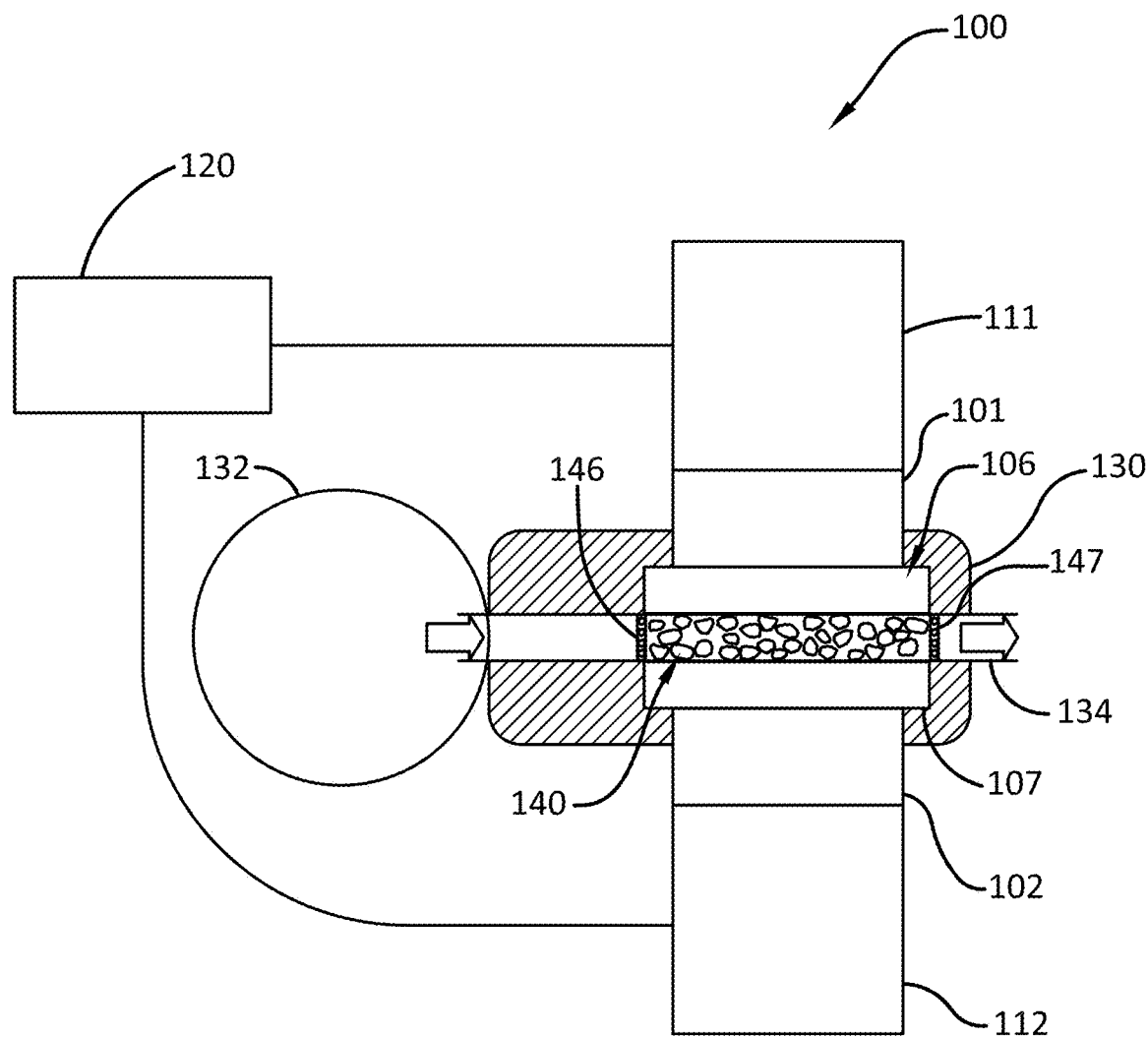
FIG. 1 is a schematic of a detection system including a high-pressure gas cell configured to contemporaneously detect molecular and radioisotope effluents.

Various technologies are presented herein pertaining to utilizing a MOF-based pressurized air detector to detect a presence of a specified substance or substances, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

Sensing systems are needed that can more reliably detect gas-phase effluents of medical isotope production and nuclear fuel reprocessing and do so in real-time. In a field operation, a plume of analytes of interest may escape a source and be carried on the air to a sensing system. The system disclosed herein loads a MOF-based detector with pressurized air, storing large quantities of air in a MOF sorbent bed. The MOF can be selected to bind analytes of interest, further enhancing the selective concentration of analytes of interest in the MOF sorbent. This substantial increase in the sample density of the air enables immediate (or nearly immediate) and contemporaneous detection of ionizing radiation (such as radioactive isotopes) or airborne molecules of interest. Multiple sensors can be used, e.g., detectors for gamma and beta radiation, chemical detectors, along with monitoring on a time axis, to detect characteristic plumes of analytes. This allows the system to produce multiple axes of data to detect a combination of properties in the detected signal, and by searching for various signatures common to known analytes, the pressurized system can quickly detect such analytes with a higher confidence level.

FIG. 1 discloses an embodiment of the multi-axis sensing system 100, in which nanoporous Metal-Organic Framework (MOF) materials enable monitoring of gas-phase effluents. In this embodiment, beta and gamma events, produced by sorption of radioactive isotopes on an S-MOF sorbent, are detected using a "dual phoswich" configuration. The dual design enables greater efficiency and new operating modes based on coincidence and anti coincidence. It enables low threshold β counting, β-γ coincidence spectroscopy, and discrimination against spurious background events. For example, a ration (cosmic background radiation) will excite the scintillating MOF sorbent and both scintillating photodetectors, and can be rejected. On the other hand, every beta may be detected in both PMTs, which could eliminate dark counts and enable lower detection threshold by requiring coincidence. The phoswich principle allows these signature to be well separated.

The sensing system 100 includes a stack of first and second scintillators 101, 102 that have dissimilar pulse shape characteristics. The first and second scintillators 101, 102 are stacked in opposition to each other, optically coupled, and associated with a first and second photodetector, (in this case a photomultiplier tube, PMT) 111, 112. A window 106, 107 is coupled to the first and second photodetectors 111, 112. A window 106, 107 can be utilized to support the MOF sorbent and optically couple it to the scintillator and/or photodetector. The window 106, 107 is transparent (e.g., optically transparent) to one or more electromagnetic particles (e.g., photons) originating from the MOF sorbent. The window 106, 1017 can be formed from a suitable material, such as, for example, sapphire, glass, quartz, epoxy, or a polymer.

In an embodiment, a single scintillator can be used, or more scintillators, e.g., 3-10, or 4 to 6 can be used instead of two as shown in FIG. 1. Different gamma and/or beta scintillators can be used with the device. Multiple scintillators may be employed to eliminate the "wall effect." Multiple scintillators can be used in addition to the MOF scintillator. Alternatively, in an embodiment, a single PMT can be used which is configured to be common to the two or more scintillators. Finally, in another embodiment, a different or additional type of detector can be used other than a PMT. This can be another type of photodetector or a chemical detector.

The output from the photodetectors 111, 112 can be processed by a computing device 120. Processing of the sensor signals from the system 100, including computer-based pulse shape analysis can be performed at the computing device 120. Pulse-shape analysis can be used to distinguish the signals from the scintillators, identifying in which scintillator the event occurred. Output from other detectors can also be processed at the computing device 120.

The system 100, also comprises a pressure cell 130 that encompasses at least a MOF sorbent 140. A pump 132 is coupled to the pressure cell 130 upstream of the MOF sorbent 140. An exhaust port 134 is also coupled to the pressure cell 130 to vent excess pressure after the air has filtered through the MOF sorbent 140. In an embodiment, an upstream porous grate 146 and a downstream porous grate 147 contain the MOF sorbent, which may be in particulate or granular form.

Each of the optical components listed above may be coupled or layered on another using an index-matching medium, which may comprise an optical grease such as polydimethylsiloxane or other optical interface materials (i.e., curable optically-transparent materials such as epoxies, silicones, or polymers). The index-matching properties are intended to minimize losses due to reflection/refraction at index-mismatched interfaces (e.g., between the MOF sorbent 140, the window 106, 107, the scintillator 101, 102, and the photodetectors 111, 112). In an embodiment, the coupling may be achieved through covalent bonding, attachment through a self-assembled monolayer, or a spin-coated layer of particles. More details of certain components of the system 100 are provided below.

The MOF sorbent 140 provides an ability to tailor the system 100 to a desired analyte (by appropriate selection of MOF characteristics to bind the analyte), and to increase the amount of air that can be compressed in the sampling chamber, i.e., the area that the detectors are configured to detect. MOFs are crystalline materials comprised of metal cations connected to rigid organic "linker" molecules by strong coordination bonds, creating a highly ordered nanoporous structure. These materials possess an unprecedented degree of structural and chemical flexibility that allows systematic variation in a porous environment.

MOFs can provide enormous surface area compared to other types of filters or porous materials. This allows a surprising amount of gas to be compressed within them, even more than if the chamber were empty. A MOF-filled vessel can hold more gas than an empty one because the surface area of the MOF is much higher compared with the vessel. Gas molecules adsorb to surfaces, so more molecules will be adsorbed and contained in a MOF than in an empty chamber.

For sensing purposes, MOFs have a combination of tunable structural and chemical properties that enable them to be used for both radioisotope and chemical detection. This makes them unique relative to other microporous sorbents such as zeolites. MOFs can be used as scintillators to aid in detecting ionizing radiation, as chemical recognition layers to enable molecule-selective sensing, and certain MOFs can efficiently adsorb noble gas isotopes that may be effluents of nuclear fuel reprocessing.

Additional advantages of MOFs relative to conventional sorbents such as zeolites are their low density and more favorable mechanical properties. Some high-capacity MOFs have densities nearly a factor of five lower than zeolites, leading to gravimetric storage capacities more than a factor of 2.5 higher at 45 bar than Zeolite NaY. MOFs are also softer and more compliant than zeolites, suggesting that fracturing of the material and dust formation, both of which can lead to mechanical failures in valves and pumps, should be reduced.

The uptake of gases by MOFs has been the subject of extensive research during the past fifteen years, primarily for storage of gases such as $H_2$, $CH_4$, and $CO_2$. Other research has been done on MOFs for collection and separation of noble gases to address the need for energy-efficient alternatives to cryogenic distillation used to separate Kr and Xe from air. Systematic investigations were performed that probed the influence of polarizable groups and open coordination sites on the framework metal ions on $N_2$ and noble gas uptake, and lead to the development of computational tools for rapid screening of MOFs. The importance of framework structural tailorability was also explored, and it was determined that exquisite selectivity for diatomic molecules over monatomic gases can be achieved by fine tuning pore dimensions. See J. A. Greathouse; S. L. Teich-McGoldrick; M. D. Allendorf "Molecular Simulation of Size-selective Gas Adsorption in Idealized Carbon Nanotubes," Molec. Sim. 2015, Vol. 41, 1388-1395, doi. 10.1080/08927022.2015.1007054.

Some structural features for MOFs useful in embodiments disclosed herein include MOFs with a main metal comprising closed-shell metal ions including $Mg^{2+}$, $Al^{3+}$, $Zr^{4+}$, $Zn^{2+}$. Linker groups can incorporate aromatic organic groups (e.g., diphenyl, triphenyl, naphthalene, anthracene) having two or more carboxylate groups. Other functional groups in the molecular structure may be included as well (to promote gas uptake and selectivity), e.g., —$CH_3$, —$NH_2$, —OH, —O— (oxo), —$C_2H_5$, and —$CF_3$. Cubic topology may be preferable in some embodiments. Additional disclosure on MOFs suitable for use herein can be found in J. J. Perry IV, P. L. Feng, S. T. Meek, K. Leong, F. P. Doty, M. D. Allendorf "Connecting Structure with Function in Metal-Organic Frameworks to Design Novel Photo- and Radioluminescent Materials," J. Mater. Chem. 22 (2012), 10235, incorporated herein by reference.

Specific examples of MOFs useful herein include UiO MOFs, e.g., with zirconium as the main metal, and linkers comprising dicarboxylate. For example, UiO-67 (diphenyldicarboxylate linkers), Zr-1,4-NDC (naphthalene-(1,4)dicarboxylate linkers). See J. Hafizovic Cavka, S. Jakobsen, U. Olsbye, N. Guillou, C. Lamberti, S. Bordiga, K. P. Lillerud J. Am. Chem. Soc. 2008, 130, 13850-13851; T. C. Wang; F. P. Doty; A. I. Benin; J. D. Sugar; W. L. York; E. W. Reinheimer; V. Stavila; M. D. Allendorf Chemical Communications 2019, 55, 4647 10.1039/c9cc01673b incorporated herein by reference. IRMOF-n: with zinc as the primary metal ion, and linkers comprising various dicarboxylates. For example: IRMOF-8, IRMOF-8 (interpenetrated), IRMOE-9, IRMOF-10, IRMOF-15, IRMOF-16. See M. Eddaoudi, J. Kim, N. Rosi, D. Vodak, J. Wachter, M. O'Keeffe and M. Yaghi, Science, 2002, 295(5554), 469-472 incorporated herein by reference. DUT-6 having a zinc metal ion, and linkers (there are 2 in the structure): benzene-1,3, 5-trisbenzoate and napthalenedicarboxylate. See N. Klein, I. Senkovska, K. Gedrich, U. Stoeck, A. Henschel, U. Mueller and S. Kaskel, Angew. Chem., Int. Ed., 2009, 48(52), 9954-9957. In an embodiment, the MOF sorbent 140 can comprise one or more of those listed above.

In an embodiment, the MOF used as the sorbent should have the ability to adsorb noble gases, i.e., helium, neon, argon, krypton, xenon, and radon. Krypton and xenon may be the most preferred for applications disclosed herein. In an embodiment, the MOF should have a selectivity of >2, e.g., 2.1 to 100, or 3 to 10 for noble gases over other atmospheric components. Selectivity may be determined based on IUPAC 2001 recommendations. See J. Vessman, R. I. Stefan, J. F. van Staden, K. Danzer, W. Lindner, D. T. Burns, A. Fajgelj and H. Müller, Pure Appl. Chem., 2001, 73, 1381-1386.

In an embodiment, the MOF is highly transparent which avoids self-absorption of radioluminescence generated by a scintillating MOF or produced by a scintillator elsewhere in the detection chamber (for cases in which the MOF is not scintillating). See T. C. Wang; F. P. Doty; A. I. Benin; J. D. Sugar; W. L. York; E. W. Reinheimer; V. Stavila; M. D. Allendorf "Get the light out: nanoscaling MOFs for luminescence sensing and optical applications," Chemical Communications 2019, 55, 4647, 10.1039/c9cc01673b, incorporated herein by reference. For example, the MOF can have a light transmittance of, for example, 90% to 100% light transmittance, such as 92% to 98%, or 95% to 97%. However, in another embodiment, the MOF can have low transparency for applications where sensors are highly sensitive, and/or as here, the signal strength is boosted by concentrating the sample. In such embodiments, a light transmittance of 8% to 100% may be useful, or 10% to 50% or 12% to 25%. Test conditions from J. Lindstrom; G. A. Carlsson "A Simple Model for Estimating the Particle Size Dependence of Absolute Efficiency of Fluorescent Screens," Phys. Med. Biol. 1999, 44, 1353, 10.1088/0031-9155/44/5/319 (incorporated herein by reference) may be used to determine light transmittance.

In an embodiment, scintillating nanoporous MOFs can be used as the sorbent bed. While ionizing radiation (e.g., beta or gamma particles) from an analyte adsorbed by a MOF can exit the MOF and interact with an external scintillator to produce light detectable by a photodetector, improved detection can be achieved in some cases when the MOF itself is a scintillator. A scintillating MOF can be excited by a sample adsorbed on it or otherwise interacting with it, thereby causing it to scintillate and give off detectable radiation. Thus, the analyte can be indirectly detected by the scintillation of the MOF. A combination of direct and indirect signal can provide a unique signature for certain analytes that improves the reliability/accuracy of the detection for that analyte.

In an embodiment, the MOF can be luminescent, a prerequisite for a scintillator. MOFs exist that are both bright scintillators and efficient sorbents for noble gases, for example, DUT-6 and Zr-NDC. Moreover, in a detailed and systematic investigation, it was shown that scintillation properties, such as light output and timing, can be correlated with aspects of MOF structure. J. J. Perry IV; P. L. Feng; S. T. Meek; K. Leong; F. P. Doty; M. D. Allendorf "Connecting Structure with Function in Metal-Organic Frameworks to Design Novel Photo- and Radioluminescent Materials," J. Mater. Chem. 2012, 22, 10235, 10.1039/c2jm16627e (incorporated herein by reference).

The nanoporosity of MOFs imparts a major advantage as a scintillating material: light output can be increased by infiltrating the pores with organometallic complexes that are known harvesters of triplet excitons. In principle, this can increase the light output by as much as 300%, since ionization of the scintillating moieties in the MOF creates three triplet excitons for every singlet exciton. See M. D. Allendorf; M. E. Foster; F. Leonard; V. Stavila; P. L. Feng; F. P. Doty; K. Leong; E. Y. Ma; S. R. Johnston; A. A. Talin "Guest-Induced Emergent Properties in Metal—Organic Frameworks," J. Phys. Chem. Lett. 2015, 6, 1182 (incorporated herein by reference). This concept has been developed for organic light emitting diodes (OLEDs) and can be extended to MOFs and plastic scintillators as well. See U.S. Pat. No. 8,853,651, and P. L. Feng; J. Villone; K. Hattar; S. Mrowka; B. M. Wong; M. D. Allendorf; F. P. Doty "Spectral- and Pulse-Shape Discrimination in Triplet-Harvesting Plastic Scintillators," IEEE Trans. Nucl. Sci. 2012, 59, 3312, 10.1109/tns.2012.2213609 (each of which are incorporated herein by reference).

Size and volume of the pores of the MOF sorbent 140 can be tuned through functionalization of one or more organic linker groups of the MOF. Accordingly, the MOF sorbent can have pore geometries and chemical environments that are favorable for uptake of the analyte of interest. Selection of a MOF material to form MOF sorbent 140 can be based in part upon a diameter of an analyte (e.g., an analyte kinetic diameter), and further upon other factors such as the presence of stabilizing proton-accepting groups. While an analyte molecule may have a particular end-to-end molecular length or kinetic diameter, the molecule can also fit into a pore that is smaller than these dimensions by translating along an axis with a narrower length (e.g., a diatomic molecule is narrower along its interatomic axis than its kinetic diameter). For example, in certain embodiments, the diameter of the pores of the MOF sorbent 140 may be about 0.5 nm to about 10 nm, about 1 nm to about 5 nm, or about 2 nm to about 7 nm.

The MOF sorbent 140 structure can be modified in a plurality of ways. In an embodiment, the pore size of the MOF and its chemical affinity for the analyte can be modified by utilizing tailored ligand design. The size of the ligand can be tuned through methods known to those skilled in the art, e.g., increasing pore size through adding additional aromatic groups to the linker. Further, the chemical affinity of the interior MOF surfaces can be modified through functionalization with different groups, including but not limited to: hydroxyl, amine, aldehyde, ketone, halide, porphyrin, amide, and combinations thereof.

In another embodiment, direct, covalent bonding of luminescent molecule into the MOF structure can be engendered to produce a scintillating MOF. This may be accomplished through the addition of suitable coordinating groups, including but not limited to: carboxylic acid, pyridine, imidazole, and thiophene with affinities to the luminescent group.

In an embodiment, the luminescent compound is of a sufficiently small size so that it will infiltrate into the MOF pores using capillary action or, alternatively, in-situ growth of the MOF structure around luminescent compound. Molecules comprising luminescent compound may be covalently bonded to metal ions comprising the MOF sorbent 140. As previously mentioned, a fluorophore can comprise a fluorescent turn-on compound which can be utilized for the luminescent compound. Materials suitable for application as a luminescent compound can have intrinsically low background emission in the non-luminescent pre-exposure state, while providing high selectivity for analyte molecules.

Two examples of compound classes suitable for utilization as luminescent compound are cyclization-inhibited photoinduced electron-transfer complexes and chromophores that convert from a non-luminescent state to a highly fluorescent state upon exposure to an analyte molecule(s). Both compound classes can utilize an irreversible nucleophilic cyclization reaction between a pendant alcohol of the chromophore and the highly electrophilic phosphorus atom(s) of an organophosphate molecule(s). Utilizing both types of compounds enables fast, sensitive, and selective detection of organophosphate molecules at concentrations of less than 10 ppmv in about 5 seconds, for example 4 to 6 seconds, or more generally, less than 10 seconds. Accordingly, the system and method disclosed herein enable several orders of magnitude improvement in detection sensitivity using these scintillating MOFs in conjunction with the pressurization of the MOF sorbent 140 and the additional scintillator.

The photodetector 111, 112 is shown in the system 100 of FIG. 1. In an embodiment, the photodetector can be a photomultiplying tube, or a silicon-based photomultiplier (Si-PM). The photodetector 111, 112 can be located on, or proximate to, the MOF sorbent. In an embodiment, the photodetector 111, 112 is coupled to (directly or indirectly) the scintillator 101, 102.

Instead of, or in addition to the photomultiplier, a second sensor or additional sensors can be included in the system 100, to capture other or additional characteristics of the sampled air. In an embodiment, MOF-based sensors can be used, e.g., those described in Lauren E. Kreno, Kirsty Leong, Omar K. Farha, Mark Allendorf, Richard P. Van Duyne, and Joseph T. Hupp, Metal-Organic Framework Materials as Chemical Sensors," Chem. Rev. (invited review article), 2012, 112 (2), pp 1105-1125 DOI: 10.1021/cr200324t, incorporated herein by reference. In an embodiment, one or more of the following chemical sensors can be used: solvatochromism sensor, vapochromism sensor, radioluminescence sensor, interferometer, localized surface plasmon resonance sensor, impedence spectroscopy, electromechanical sensor, quartz crystal microbalance sensor, surface acoustic wave device, microcantilever device, or combinations thereof. The physical/chemical sensor would, in an embodiment, be located in or with sensor access to the pressurized volume to take advantage of the pressure sorbents concentrate analytes from air and lower the detection threshold for any given sensor type.

In an embodiment, to detect molecular effluents, compact, low-power micro-electromechanical (MEMS) sensors may be utilized (for example, surface acoustic wave devices or quartz crystal microbalances) that are coated with MOF thin films that enhance sensitivity and enable selective detection. These may be used in place of or in addition to the photodetector. Calculations suggest that real-time detection/identification of radioisotopes at ppb levels are feasible with this design, without using large-volume air separation techniques.

In an embodiment, the design of the system 100 enables a novel "multi-axis" sensing concept, in which the MOF sorbent 140 allows radioisotope detection along the axes of β counts above background, coincident γ energy, timing distribution, and continuous integrated signal (real time), generating a unique combination of signals that can be correlated with the species of interest. The computing device 120 associated with the system can be configured to sort through the data to provide this correlation of signals.

Figure 2:
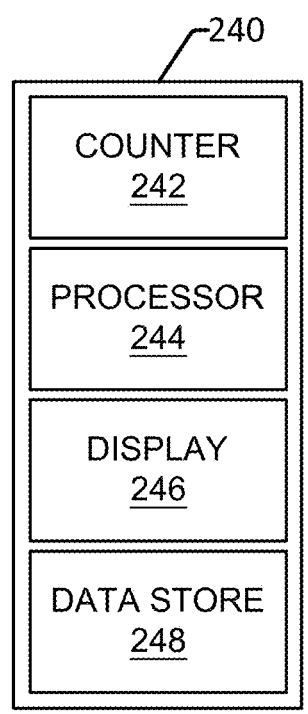
FIG. 2 is a schematic of an embodiment of a computing device.

FIG. 2 shows a more detailed view of an embodiment of a computing device 240 for use with the system 100, which may be the computing device 120 of FIG. 1. The computing device 240 can include a counter component 242 which can be utilized to provide various indicators of electrical energy being received from the system 100, e.g., where such indicators can include, for example, a count, a number of counts for a given time period, magnitude of counts, intensity of counts, as generated by each photon, which is incident upon the photodetectors 111, 112. The computing device 240 can further include a processor 244 utilized to facilitate determination of a presence of one or more analytes for a given environment or test sample. For example, the processor 244 can control operation of the counter component 242 to enable collection of the electrical energy count(s). Further, the processor 244 can control operation of a display component 246 which can be utilized to present information pertaining to the detection of one or more analyte molecules, such as a count value, a count vs. time value, a measure of actual analyte molecules detected, a measure of estimated analyte molecules for a given volume (e.g., the MOF sorbent 140).

The computing device 240 can further include a data store 248 which can be utilized to store, for example, data and/or instructions relating to the magnitude of electrical energy received from the system 100, number of analytes detected, or concentration of analytes. To facilitate controlling operation of the computing device 240 in accordance with a data collection window, a timer (e.g., a clock) can be utilized to control operation of the system 100 and detection of the photons. For example, data collection can be analyzed over a particular time window that is relevant to detection of plumes of ionizing radiation or molecules. For example, 1 minute to 45 minutes, such as 5 minutes to 30 minutes, or 10 minutes to 25 minutes can be utilized as a duration for an analysis window.

The apparatus 200 can further include a switch component which can be controlled by the processor 244 (e.g., in conjunction with the timer) to operate the valve. The computing device 240 can also control the pump 132, and the pressure in the system 100.

One or more scintillators 101, 102, can be included in the system that are excited by the material retained in the MOF sorbent 140. In an embodiment, this scintillator is a gamma scintillator, e.g., NaI, which produces gamma radiation indicative of the analyte in the MOF sorbent 140. In another embodiment, a beta scintillator may be in place of or in addition to the gamma scintillator. In this case the scintillator may be, for example, organic crystals of anthracene, stilbene and/or naphthalene. In an embodiment, the scintillator may be a short wavelength scintillator, such as, e.g., $CeBr_3$ or $LaCl_3$:Ce.

In an embodiment, a scintillating MOF is used as the MOF sorbent 140 in combination with an additional scintillator. In this case, multi-axis detection can be performed and the computing device 120 can sort out counts versus pulse area (x-axis) and fall time (y-axis) and separate the pulses of a MOF sorbent scintillator from those of an NaT Tl scintillator.

The system 100 includes a pressure cell 130 that is pressurized in use, or, prior to loading, a pressurizable, i.e., an enclosure that is closed or closeable providing little or no air permeation. The pump 132 is configured to intake ambient air, that is air from the environment in which the system is located, and pump it into the pressure cell 130 that includes the MOF sorbent 140. In an embodiment, the MOF sorbent 140 provides a substantial barrier to air leaking out of the pressure cell 130, but allows some flow through the exhaust port 134 once a threshold pressure is reached. The term pump is used broadly to include pumps, compressors or other equipment that is capable of applying pressure to a system.

In an embodiment, a valve (not shown) is coupled to the cell, e.g., between the exhaust port 134 and the MOF sorbent 140. The valve allows higher pressures to be reached in the pressure cell 130. In this embodiment, the valve can be open and closed to modulate between high-pressure loading sessions, release sessions, and high-pressure reloading sessions. Sensor readings may be taken when the pressure is high and the valve is shut.

One or more pressure gauges (not shown) may also be coupled to the pressure cell 130. These may be located before and after (upstream and downstream) the MOF sorbent 140, so as to monitor pressure in both areas, and determine the loading of air in the MOF sorbent 140 itself.

Real-time radioisotope detection is enabled using a running average to achieve up to 36 above background for small excursions by pressurizing the air exposed to the MOF to high pressure, increasing sensor response by as much as two orders of magnitude for trace gases. In an embodiment, the pressure (measured between the pump 132 and the MOF sorbent 140) may be increased by the pump 132 to a level of 1.3 to 350 bar, such as, for example, 10 to 250 bar, or 50 to 200 bar.

The ultra-high surface areas and tailorable nanopores of the MOF materials will adsorb trace analytes, e.g., radioactive xenon or other noble gases that interact strongly with the nanopores and exclude weakly interacting majority components of air. This architecture also avoids the need for complex hardware designed to separate and concentrate trace species from air.

A consideration for the pressurized system 100 is the existence of background impurities in a sampling atmosphere. For example, luminescent impurities in environmental samples can be attributed to polycyclic aromatic hydrocarbons that originate from common sources such as automotive exhaust or industrial volatile organic compounds (VOCs). While pressurizing the system enhances the content of the analyte of interest, it may also enhance the content of background impurities that cause noise in the data.

One or more methods can be utilized to eliminate undesired fluorescent background compounds, molecules, contaminants, etc., wherein such methods can include: (1) photolytic pre-treatment of the sampling air volume (gas mixture), (2) sequential multi-wavelength excitation spectroscopy, and (3) design the MOF sorbent 140 to filter and/or exclude uptake of larger VOCs.

For photolytic pretreatment of the sampling air volume, UV pre-treatment of the MOF sorbent 140 can enable efficient conversion of common luminescent impurities to form non-luminescent products. For example, dominant diesel exhaust components naphthalene and acenaphthalene are efficiently oxidized to non-luminescent ketones upon photolysis in air. In contrast, analyte molecules (e.g., an organophosphate) in the MOF sorbent 140 can remain unaffected by such pretreatment as the analyte molecules can possess small UV absorption cross-sections and exhibit high photostabilities. Interferences are further eliminated by a sample-purge-read sequence configured to preferentially retain the analyte and expose it to minimal photobleaching during acquisition.

In method 3 mentioned above, a readout sequence can be utilized that uses multi-wavelength excitation spectroscopy as a means to provide positive identification of a specific analyte. Such a readout sequence is analogous to the analytical technique of synchronous fluorescence spectroscopy, which is utilized for the quantitative characterization of complex mixtures of luminescent compounds. The readout sequence enables correlation of any wavelength-dependent excitation and emission properties of each fluorophore to serve as a characteristic spectral fingerprint.

The third method, MOF selection or design, can be a design consideration in the construction and synthesis of the MOF sorbent 140 that is discussed further elsewhere herein. The application of any one or combination of the above three methods 1-3 can improve analyte discrimination by the system 100.

In an embodiment, one or more additional filters (not just the MOF sorbent 140 itself) can be utilized to filter out undesired species in the sampled gas. For example, a filter is available to remove radon. Particulate filters can remove airborne activity from radioisotopes other than krypton and xenon. This is another method that can be used to reduce background noise. In particular, a filter can be utilized to facilitate removal of light generated by undesired background effects (e.g., background luminescence arising from naphthalene in diesel exhaust). The filter would be located between the MOF sorbent and the sensor, e.g., one or more photodetectors 111, 112. The filtering can allow photons of a desired wavelength to pass through to the photomultiplier and prevent photons of other wavelengths from passing through to the photomultiplier.

Figure 3:
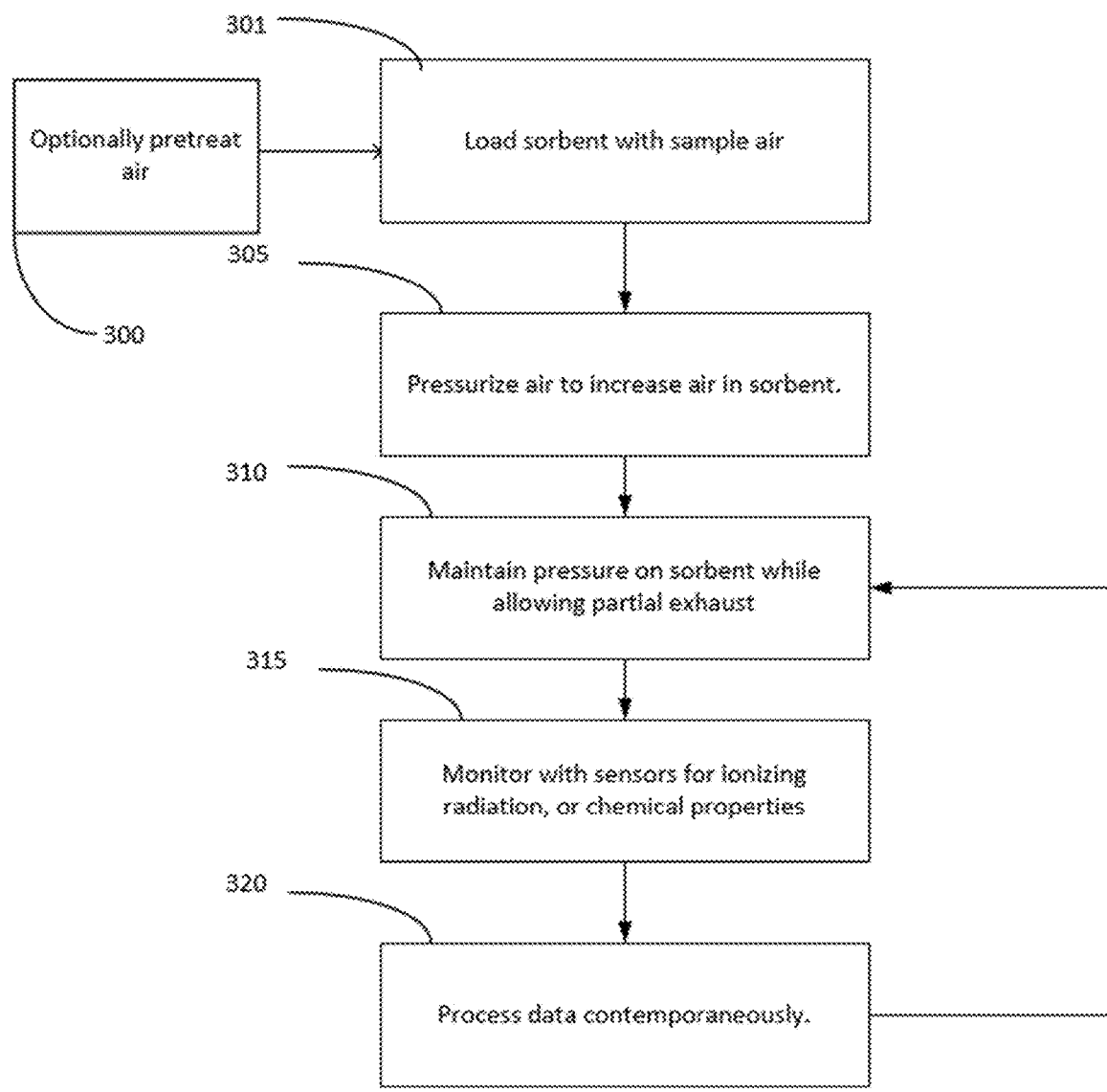
FIG. 3 is a process chart showing an exemplary method for detecting analytes.
Figure 4:
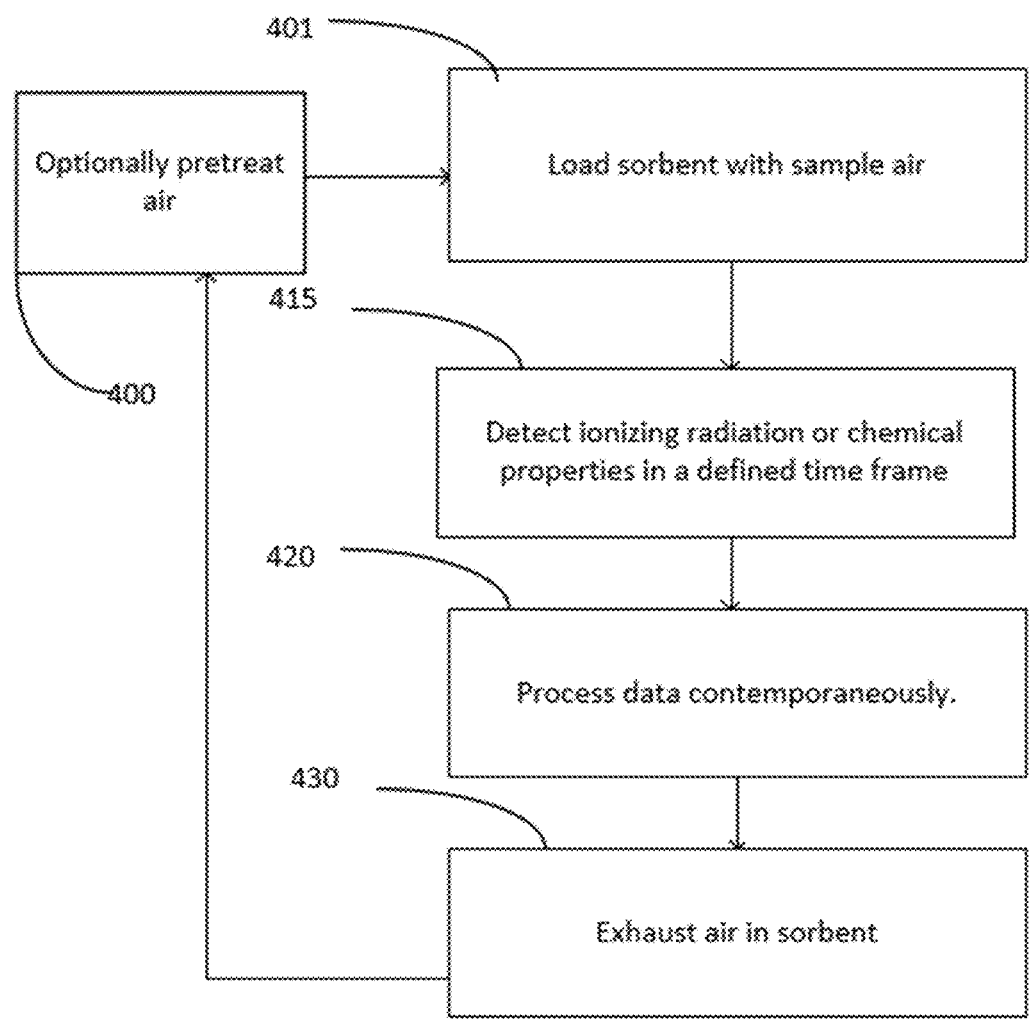
FIG. 4 is a process chart showing a second exemplary method for detecting analytes.

FIGS. 3 and 4 illustrate an exemplary methodology relating to utilizing a pressurized sorbent to detect an analyte. While shown and described as being a series of acts that are performed in a sequence, it is to be understood and appreciated that the methodologies described herein are not limited by the order of the sequence. For example, some acts can occur in a different order than what is described herein. In addition, an act can occur concurrently with another act. Further, in some instances, not all acts may be required to implement the methodologies described herein and other acts may be included.

FIGS. 3 and 4 illustrate methodologies for utilizing a pressurized sorbent to detect a presence of an analyte molecule(s). These methodologies may be conducted at or near a suspected site of contamination with the analyte of interest. For example, the site may be a nuclear power plant, a facility that produces or utilizes isotopes for use in the medical field, or an area suspected of containing an active or detonated nuclear or radioactive weapon.

The analyte of interest may be, for example, a medical isotope such as: Xenon-133, other noble gas isotopes used in production of medical gasses, in particular radioxenons.

The analyte of interest may be, for example, a radioactive by-products of a nuclear reactors such as, radiokryptons and radioxenons. Other isotopes are less volatile or reactive leading to particulate activity that, in an embodiment, may be filtered out.

At step 301, a sorbent, e.g., a MOF sorbent, is loaded with a fluid sample containing an analyte, in this embodiment the fluid is air. The air can be untreated ambient air, or, at step 300, it can be pretreated by a method above to remove known luminescent contaminants, such as fused ring aromatics from diesel emissions. In addition, or instead, the air can be pretreated a step 300 by dehumidifying through a dehumidifier to remove humidity.

At step 305, the sample air is further loaded into the sorbent, by pressurizing the air via a pump.

At step 310, the pump and an associated pressure-control valve maintain the pressure in the sorbent and a steady flow of gas through the sorbent. Without the pressure maintenance from the pump and control valve, the sorbent may lose, for example, 1 to 25%, such as 2% to 20%, or 5% to 15% excess pressure over ambient in an interval of less than 1 minute, 1 minute to 1 hour, such as 5 minutes to 30 minutes, or 10 minutes to 20 minutes. In an embodiment, the pressure could be regulated at the output, and the flow rate controlled on the input or vice-versa.

At step 315, the sensors monitor for ionizing radiation or chemical properties while the pressure is maintained. Here, the fluid pressure in the sorbent is maintained while contemporaneously pressurizing the fluid and exhausting fluid from the sorbent during the detecting step.

At step 320, the data received from the processors is processed contemporaneously as it is received and displayed to a user. This real-time processing is continued as the pressure is maintained and the sensors continue to monitor the analytes in the sorbent. This is illustrated with the arrow circling back to step 310. Processing may include, for example, receiving data relevant to a combination of properties of the analyte in the sorbent, processing data relevant to the combination of properties; and searching for the same combination of properties among multiple data signatures of known analytes stored in data store having the same combination of properties. The computing device may be configured to match the signature set of data of the analyte to a signature in the data store.

FIG. 4 discloses an alternative methodology similar to that of FIG. 3, where steps 400, 401, and 420 are as described above. However, FIG. 4 monitors the air sample by loading and venting the sorbent at defined time intervals instead of the air sample being slowly and continually replaced. This method allows determination of a sample with greater precision if the activity is variable.

At step 415, detection of ionizing radiation or chemical properties is performed by the sensors in a defined time frame. The time frame may be, e.g., 1 minute to 1 hour, such as 5 minutes to 30 minutes, or 10 minutes to 20 minutes. The time frame may begin once the sorbent is fully pressurized to the desired pressure and ends before the pressure is released.

Like the methodology of FIG. 3, at step 420, the data received from the sensors is processed contemporaneously as it is received, at least as often as the end of a time frame, but possibly throughout the time frame.

At step 430, the air is exhausted from the sorbent. In an embodiment, this can be followed with a purge of new ambient air or an inert gas purge, to flush out the old sample, prior to fully repressurizing the sorbent again at step 401 and continuing through the steps again. This is illustrated with the arrow going back up to step 400. These steps can be repeated numerous times, as the MOF sorbent is durable and can be loaded and unloaded numerous times, e.g., 5 to 300 or 30 to 100. The computing device can control the pump and the exhaust valve to control loading and exhausting of the samples in the time frames.

Figure 5:
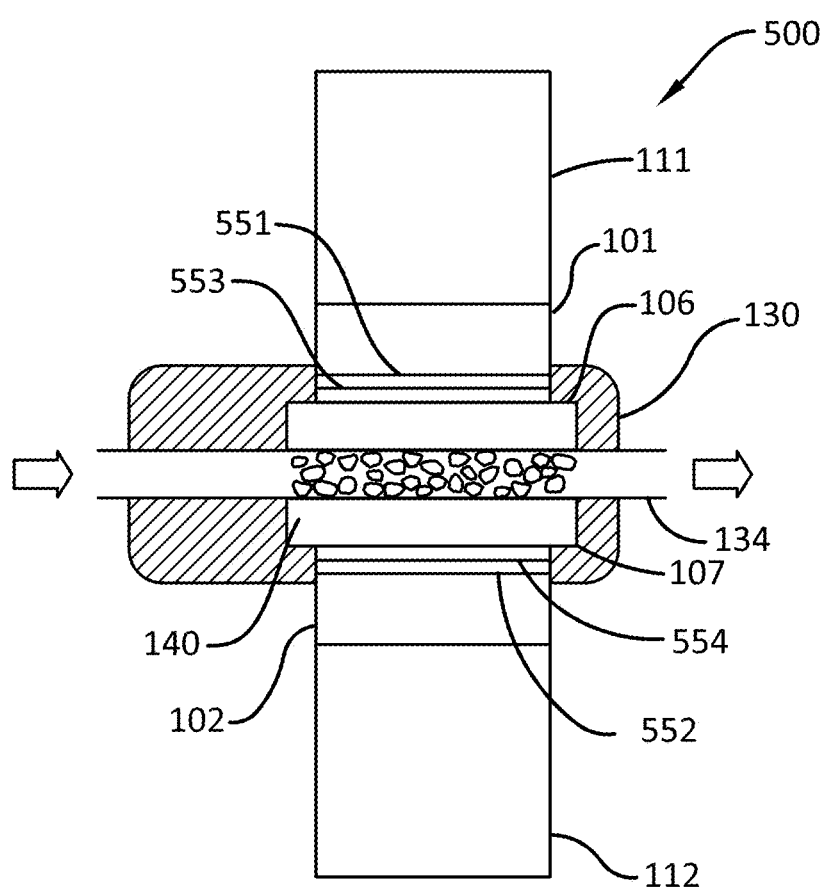
FIG. 5 is a schematic of an alternative embodiment of a pressurized detection system.

An enhanced embodiment to the pressurized system disclosed above is shown in FIG. 5. Here, the pressurized system 500 is similar to that shown in FIG. 1, with the exception that it uses a novel combination of wave-length shifters 551 and short pass dichroic (DC) mirrors 553 to guard against interference (or crosstalk) between the scintillator crystals in the dual phoswich detectors. The dichroic mirror may be configured to pass blue scintillation light (e.g., cutoff may be 450 nm), which is absorbed by a wavelength shifter that re-emits in the green wavelengths. The short pass DC mirrors 553, 554 and wave-length shifters 551, 552 are optically in line with the scintillator. The short pass dichroic mirrors 553, 554 are coupled to the windows 106, 107 and the wave-length shifters 551, 552 are coupled to the short-pass DC mirrors.

Figure 6:
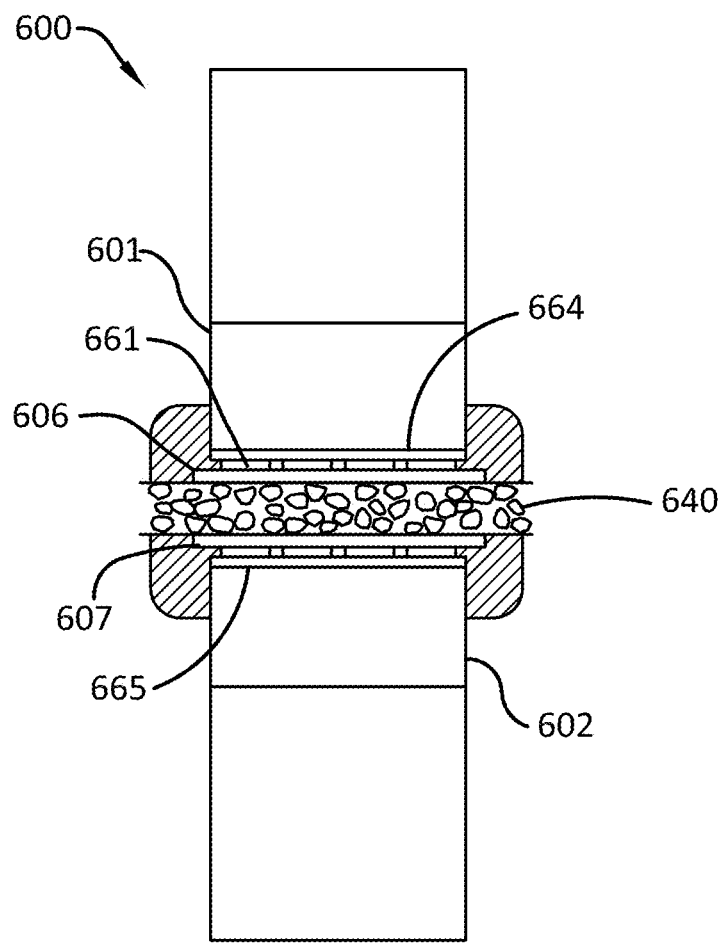
FIG. 6 is a schematic of another alternative embodiment of a pressurized detection system.
Figure 7:
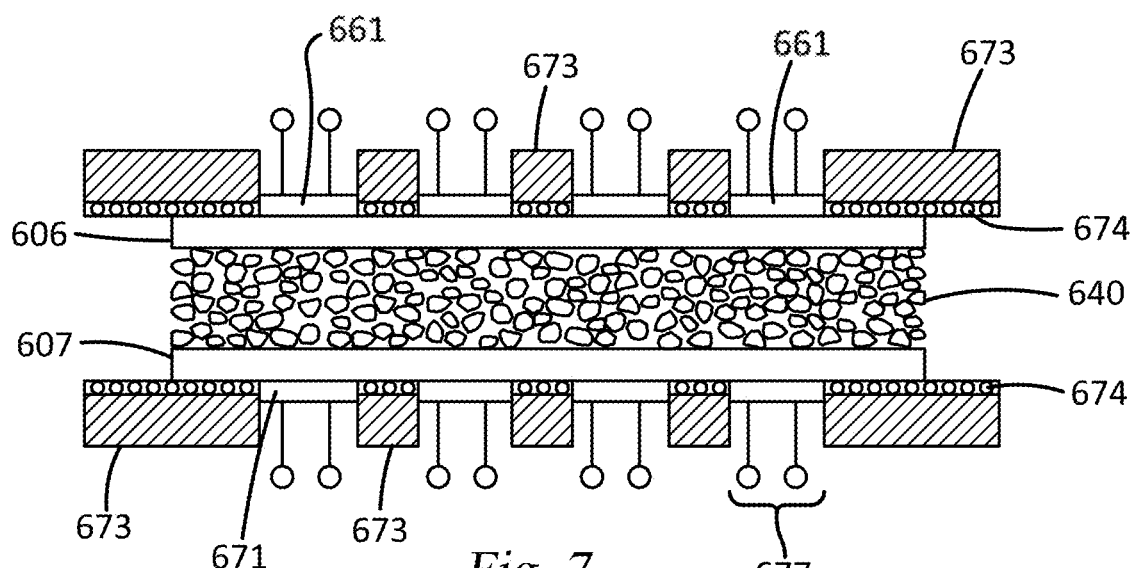
FIG. 7 is a zoomed in view of the schematic of FIG. 6.

In FIG. 6 and FIG. 7, another embodiment is shown for eliminating interference (or cross talk) that is particularly applicable to detectors that are not in a phoswich structure. In this embodiment, the photodetectors 601, 602 are optically isolated from the MOF sorbent 640, and thus only sense gamma rays. The optical isolation layer 664, 665 can be, for example, aluminum. In an embodiment, the NaI crystal is hermetically sealed in an aluminum can. The beta stimulated scintillations inside the MOF sorbent 640 are detected by solid state photodetectors, e.g., avalanche photodiodes (APDs) 661 that are coupled to the windows 606, 607. These are better seen in the exploded view in FIG. 7. A steel support 673, backed by Teflon 674, is also coupled to the windows 606, 607. There are also small apertures 677 in the steel support 673. The apertures 677 pass scintillation light from the MOF sorbent 640 to the APDs 661. Because the apertures 677 are small, the window 606, 607 can be thin. A thin window has the advantage of minimizing attenuation of the gamma signature.

In another alternative embodiment, the photodetector is located inside the pressure cell. The benefit of placing the photodetector inside the pressure cell is that it allows elimination of the windows. This simplifies the design considerations and improves light collection. This can be incorporated in all embodiments disclosed herein.

Other beta detection schemes are possible, such as direct electronic detection of betas in a solid-state detector, such as a passivated implanted planar silicon (PIPS) device, or direct charge collection of ionized air inside the cell. The latter would be challenging at high pressure but certainly workable at modest pressure above ambient, e.g., 1.3 to 5 bar, 1.5 to 4 bar, or 1.7 to 3 bar.

Figure 8:
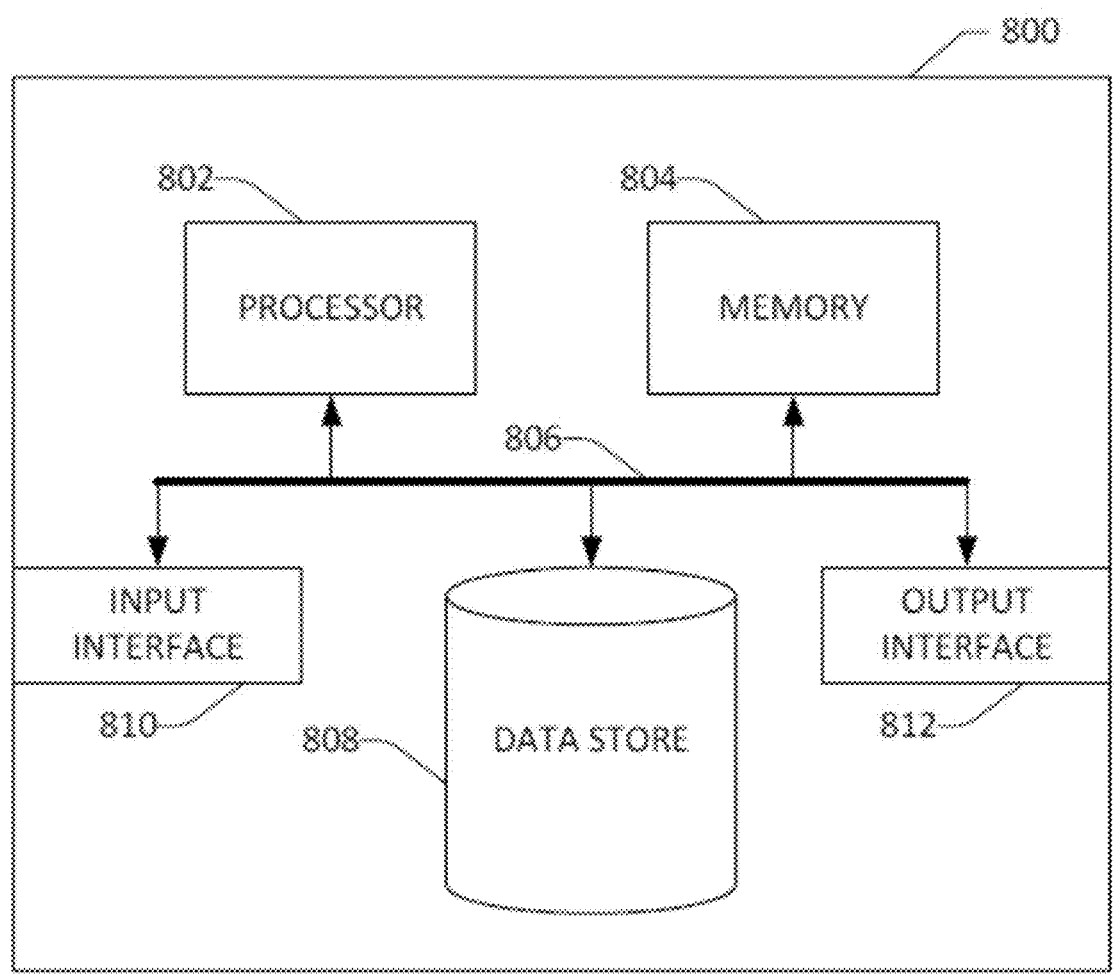
FIG. 8 is a schematic showing another embodiment of an exemplary computing device.

Referring now to FIG. 8, a high-level illustration of an exemplary computing device 800 that can be used in accordance with the systems and methodology disclosed herein is illustrated. For example, the computing device 800 can operate as the computing device 240 of FIG. 2 and the various components (e.g., components 242-248) associated therewith. The computing device 800 includes at least one processor 802 that executes instructions that are stored in a memory 804. The instructions may be, for instance, instructions for implementing functionality described as being carried out by one or more components discussed above or instructions for implementing one or more of the methods described above. The processor 802 may access the memory 804 by way of a system bus 806. In addition to storing executable instructions, the memory 804 may also store image products, SAR data, etc.

The computing device 800 additionally includes a data store 808 that is accessible by the processor 802 by way of the system bus 806. The data store 808 may include executable instructions, image products, SAR data, etc. The computing device 800 also includes an input interface 810 that allows external devices to communicate with the computing device 800. For instance, the input interface 810 may be used to receive instructions from an external computer device, from a user, etc. The computing device 800 also includes an output interface 812 that interfaces the computing device 800 with one or more external devices. For example, the computing device 800 may display text, images, etc., by way of the output interface 812.

Additionally, while illustrated as a single system, it is to be understood that the computing device 800 may be a distributed system. Thus, for instance, several devices may be in communication by way of a network connection and may collectively perform tasks described as being performed by the computing device 800.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

EXAMPLES

Example 1

The following disclosure provides guidelines for selecting and constructing the scintillator and MOF sorbent for the system described herein based on calculations performed and literature in the field.

A system figure of merit to quantify results of the system disclosed herein for β scintillation is photons detected per nanosecond per MeV of β energy absorbed. This metric is determined by: 1) intrinsic radioluminescence properties of the MOF; 2) photon transport through the composite structure; and 3) conversion to photoelectrons at the PMT photocathode.

Luminescence in S-MOFs is dominated by the luminescence of the organic linker group, enabling rational design of the generation term for our scintillation signals. Scintillation wavelengths, intensities, and timing commensurate with commercial organic scintillators have been demonstrated. 11, 15 J. J. Perry Iv; P. L. Feng; S. T. Meek; K. Leong; F. P. Doty; M. D. Allendorf "Connecting Structure with Function in Metal-Organic Frameworks to Design Novel Photo- and Radioluminescent Materials," J. Mater. Chem. 2012, 22, 10235, 10.1039/c2jm16627e; and F. P. Doty; C. A. Bauer; A. J. Skulan; P. G. Grant; M. D. Allendorf "Scintillating Metal-Organic Frameworks: A New Class of Radiation Detection Materials," Adv. Mater. 2009, 21, 95, 10.1002/adma.200801753.

Scattering and attenuation in particle composites of these materials have not been evaluated. However, the analogous problem of light emission from X-ray phosphor screens is well studied, and published data on these composites indicate feasibility of θ detection with appropriately scaled sorbent beds. Measured photon emission versus areal density from commercial screens of various phosphor materials were published by G. W. Ludwig "X-Ray Efficiency of Powder Phosphors," J. Electrochem. Soc. 1971, 118, 1152, 10.1149/1.2408271. A notable feature of these data is that the emission curves scale roughly in proportion to the light yield of the phosphor material. Thus, efficiency appears to be dominated by the intrinsic luminescence yield rather than microstructure for these composites. However, published data and analysis show that structure can also affect performance. For example, K. A. Wickersheim; R. V. Alves; R. A. Buchanan "Rare Earth Oxysulfide X-Ray Phosphors," IEEE Trans. Nucl. Sci. 1970, NS17, 57, 10.1109/tns.1970.4325559 (incorporated herein by reference) reported that the luminosity of $La_2O_2S$:Tb powders with no binder increased monotonically with grain size by a factor of 5.5 for grain diameters in the range 1.5-50 micrometers, whereas C. D. Nomicos; G. E. Giakoumakis; P. C. Euthymiou; P. X. Sandilos "Absolute Efficiency of (ZNCD)S— AG Phosphor Under Fluoroscopy Conditions," J. Appl. Sci. 1978, 49, 3636, 10.1063/1.325209 (incorporated herein by reference) found ZnCdS:Ag phosphors with 10 micron grains gave four times higher luminosity than 2-3 micron grains. Clearly, grain size has a strong influence on luminosity of the composite; therefore, the effects of particle size and packing density should be considered, as well as intrinsic light yield, on efficiency.

To maximize scintillation intensity, the areal density of the sorbent should be matched to the stopping range of β energies emitted from radioisotopes of interest. Stopping ranges for 10 keV-1 MeV β particles for typical MOF compositions were calculated using the NIST stopping-power and range tables for electrons (ESTAR web database). Based on this analysis, an optimal areal density of 265 mg/cm2 was calculated; based on data in the literature, it was estimated that light emission was on the order of 4% of the light generated. Thus, for a typical light yield of 104 photons/MeV, we estimate that a mean-energy β from a noble gas isotope will emit 100 photons from each surface of the sorbent bed, with a Lambertian angular distribution. The final step of evaluating FOM is configuring a sorbent bed with the gamma scintillator and PMT, and counting photons detected per unit of absorbed β energy.

A single-parameter model has been shown to predict light emission from phosphor powders over a large range of composition, grain size, and areal density, in excellent agreement with experiment. See J. Lindstrom; G. A. Carlsson "A Simple Model for Estimating the Particle Size Dependence of Absolute Efficiency of Fluorescent Screens," Phys. Med. Biol. 1999, 44, 1353, 10.1088/0031-9155/44/5/319 (incorporated herein by reference). The model assumes all interactions modifying the luminance can be represented by an extinction parameter, x, which can be determined by a single measurement of absolute intensity for a given MOF, or by the ratio of intensities for two samples of different areal density. Measurements of this nature enable design of excellent sorbent beds for scintillation or other optical detection modes.

Example 2 and 3

Figure 9:
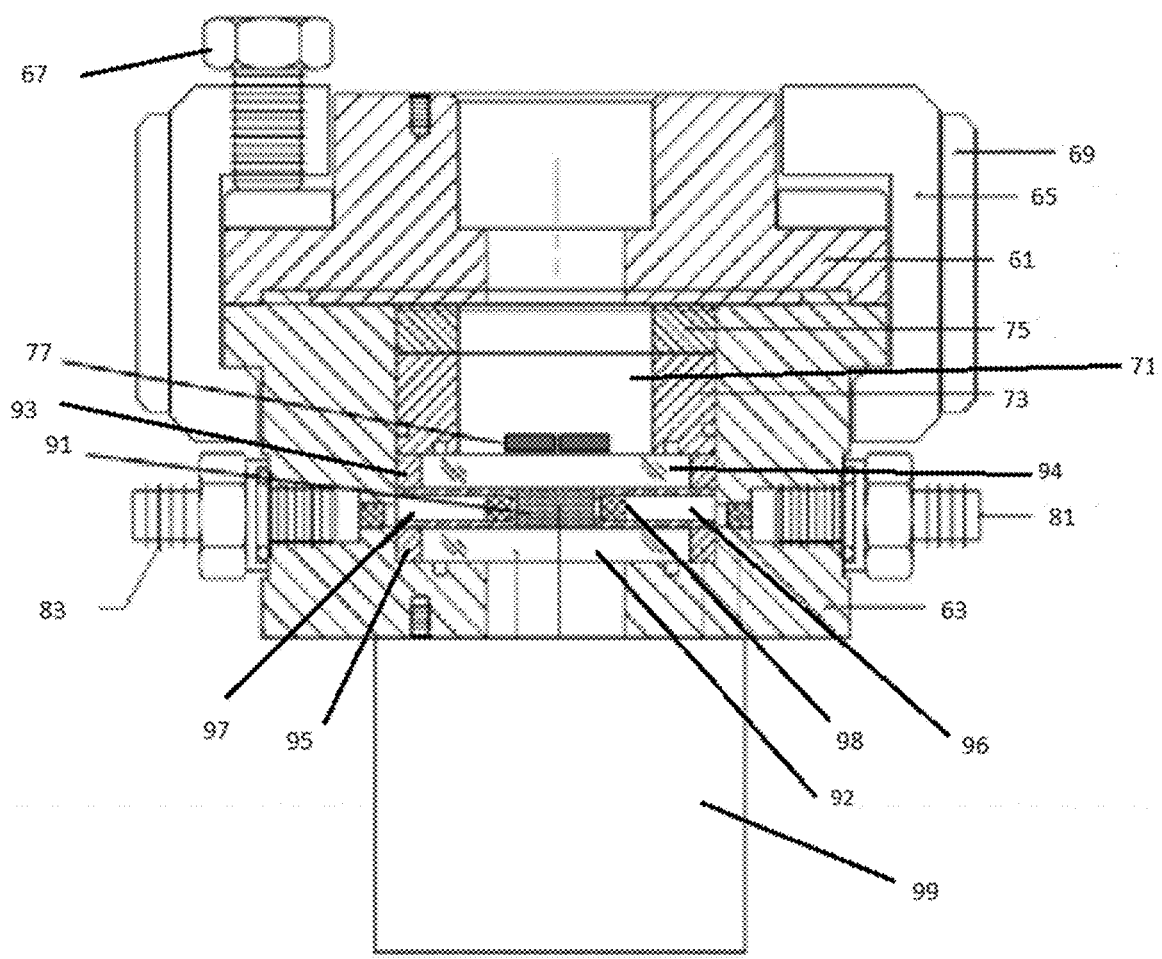
FIG. 9 is a cross-sectional view of a prototype pressurizable detection system.

A full prototype phoswich detector system was assembled and tested. FIG. 9 shows a cross-section of this prototype. A top housing 61 is coupled to a bottom housing 63 by an outer claim shell 65 secured by a bolt 67 threaded through the clam shell 65 and pressing down on the top housing 61. Other bolts 67 are present, just not shown in this view. An outer sleeve 69 encompasses the clam shell 65 further holding together and reinforcing the coupled components.

A bottom cavity 71 is formed in the bottom housing 63. Around the perimeter of the bottom cavity 71 is a sealing ram 73 which abuts a spacer 75 above it. The spacer abuts or is coupled to the bottom side of the top housing 61. In the bottom cavity 71 is a photodetector, here, an avalanche photodiode (APD) 77, which is a highly sensitive semiconductor photodiode that exploits the photoelectric effect to convert detected radiation into electricity. In this prototype the APD 77 is configured for beta detection.

On the circumference of the bottom housing 63, gas ports 81, 83 run from the bottom cavity 71 to the exterior of the device. The gas port 81 is an intake port, and gas port 83 is an exhaust port. The gas ports 81, 83 are coupled to tubes 96, 97 that each include a porous grate 98. Behind the porous grate is the scintillating MOF 91.

Also, in the bottom cavity 71 are upper and lower bushings 93, 95 that at least partially support the scintillating MOF 91 suspending it in line under the photodetector 77 and the scintillator 99. Sapphire windows 92, 94 enclose the MOF at the top and bottom and allow passage of light for detection. The bushings and supports can be interchanged to adjust for a larger or smaller scintillating MOF 91. The scintillator was a NaI Tl scintillator in a 2×2×2 inch cube. The scintillator 99 was secured to the bottom cavity 71, closing the bottom cavity 71 at the bottom edge of the bottom housing 63.

In an embodiment, the top of the device can be closed by attaching a scintillator identical or similar to the scintillator 99 attached to the bottom. Alternatively, a pressure resistant covering can be used to seal the top of the device.

For the experiment, MOF sorbents in powder form were tested by placing them in a non-scintillating glass vial on top of a 3" diameter by 1" thick sapphire window above a NaI photodetector. This photodetector (NaI crystal plus integrated photomultiplier tube (PMT)) also had a transparent window allowing scintillations from the MOF to travel through the sapphire and the NaI to excite the PMT. Except for the vial, this stack up realized the geometry of the designed single phoswich detector.

Figure 13:
FIG. 13 is a photo of stacked-up test device used for some examples.

The tests were done with a stack-up test device as shown in FIG. 13, which was inside a light-tight metal enclosure at room temp in laboratory air. Top-to-bottom the following layers are in the device of FIG. 13:

Cs$_{137}$ beta/gamma source
Glass vial with powder scintillator
Sapphire pressure window (3" dia.)
NaI detector (2" dia.)

The NaI detector was a clear cylinder inside a metal can. The metal can had glass windows on top and bottom to seal the NaI from air and moisture. The view in FIG. 13 shows looking through the second phoswich layer. At the bottom of the can a semitransparent orange layer is visible. That orange layer was the photocathode of the PMT. The rest of the PMT is not visible in this image.

Over a span of weeks, the MOF scintillation amplitudes diminished, presumably due to exposure to air. This indicates that a glove box was not essential for installing some MOF sorbents in the pressure cell.

The stack up was irradiated from above by a Cs-137 beta/gamma source. The betas directly impinged on the MOF to excite scintillations but were completely blocked from the NaI by the optical windows, while the gammas mostly passed through the MOF and windows, to excite scintillations in the NaI. Because of the relatively slow NaI radioluminescence, the two particle types were easily distinguished on "two parameter plots", that is amplitude versus rise time. The fast MOF (beta) scintillations are in the lower left corner. The slower, larger amplitude gamma spectra are distributed across the top of the plots.

Figure 10:
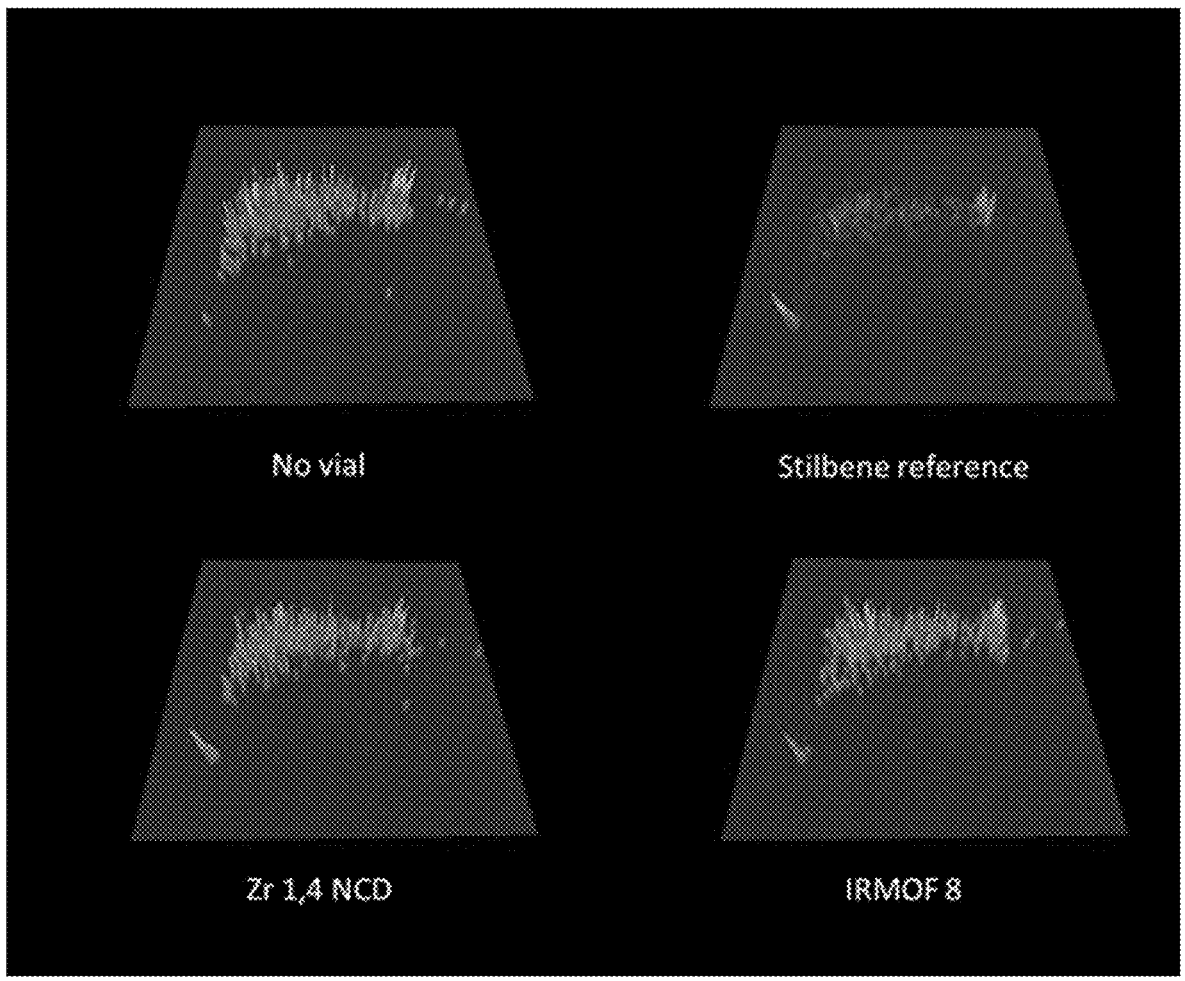
FIG. 10 is a series of spectra showing amplitude (y-axis) and rise time (x-axis) of scintillator pulses corresponding to Examples 2 and 3.
Figure 11A:
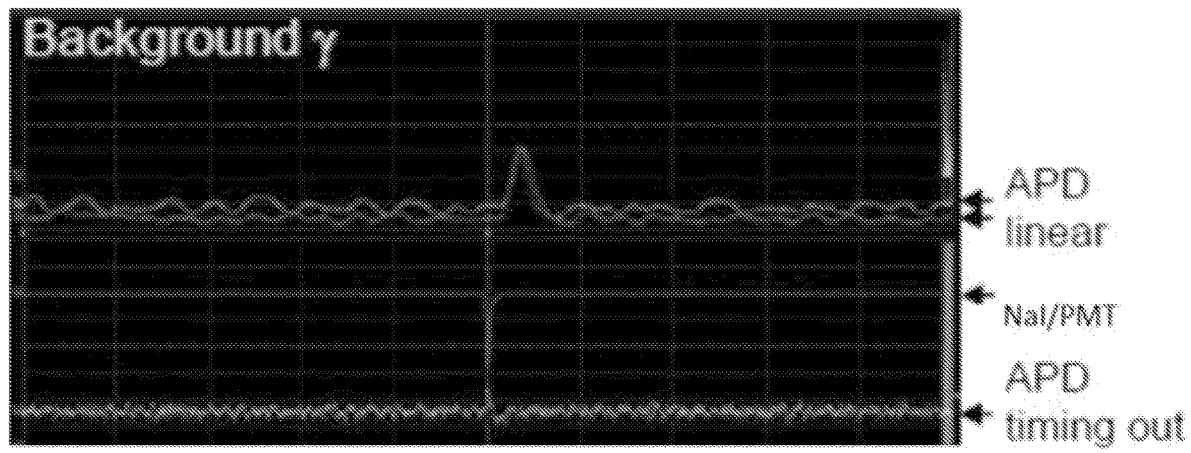
FIGS. 11A-11D are a series of parameter plots corresponding to Example 4.
Figure 11B:
Figure 11C:
Figure 11D:

FIG. 10 shows four spectra from the above test. Data was gathered and showed amplitude (y-axis) and rise time (x-axis). The pulses of the MOF scintillator were different from those of Nat Tl. In the FIG. 10 spectra, spikes in the lower left corner are the organic scintillator powders. Broad spectra across the top is from Nat Tl.

Example 2 utilized IRMOF 8 as the MOF sorbent (FIG. 10, bottom right) and Example 3 utilized UiO-66 (Zr-NDC) as the MOF sorbent (FIG. 10, bottom left). A Control Example with no vial (FIG. 10 top-left) and comparative Example with a Stilbene scintillator (FIG. 10 top-right) were also performed. The vial added a small amount of scattering material and could be very slightly radioluminescent, which is why control examples were performed with no vial present.

These examples with the prototype demonstrated that scintillating MOFs can be used effectively in the newly designed, pressurized detector.

Example 4

Experiments were performed with a dual phoswich type detector as shown in FIG. 1 modified as shown in FIGS. 6 and 7. The dual design enables greater efficiency and new operating modes based on coincidence and anticoincidence. For example, a muon (cosmic background radiation) excited the MOF powder and both NaI crystals and could thus be rejected. On the other hand, every beta may be detected in both PMTs, which could eliminate dark counts and enable lower detection threshold by requiring coincidence. The phoswich principle allows these signatures to be well separated, as was demonstrated in the parameter plots shown in FIGS. 11A-11D. The muon signature shows signals on all four channels while betas excited only the APDs Example 5

Figure 12:
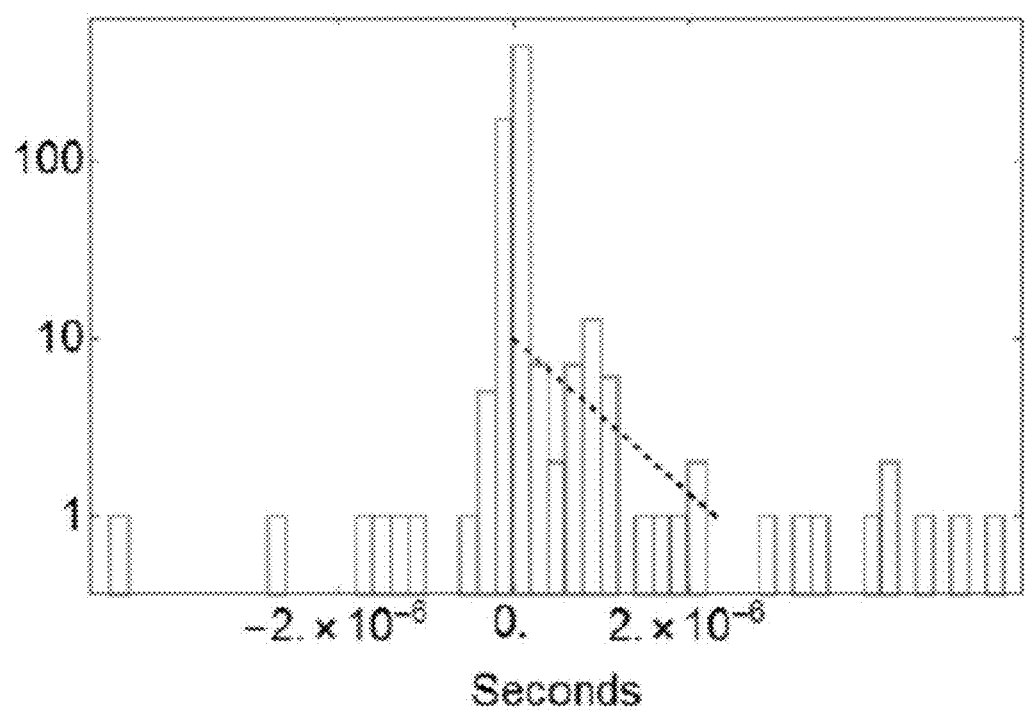
FIG. 12 is a plot showing multi-axis detection data corresponding to Example 5.

The data in FIG. 12 show a type of multiaxis detection in device with the configuration shown in FIG. 9. The configuration differs from a phoswich, but detects both betas using the MOF scintillator coupled to APDs, and time correlated gammas in an adjacent NaI crystal. The cell was pressurized to 30 psi for this experiment.

The data shows the "coincident" gammas are actually delayed by a microsecond, so the time axis functions as an added detection axis to compile a signature for the analyte. The MAS principle requires that multiple properties (i.e., responses from the analyte) are sensed, not necessarily from multiple detectors. In this case there was an energy distribution and a timing distribution, which gave a highly specific signature for the isotope.

Table 1 shows additional data for the experiment.

TABLE 1

| Expected rate of gamma detection | |
|---|---|
| window transmission | |
| solid angle/4π | |
| total attenuation | |
| PE/total | |
| Branching ratio | |
| gammas detected per beta | 0.00022 |
| beta activity | 1 Bq |
| gamma rate | 0.00022 /s |
| | 0.792 /hr |
| | 19.008 /day |

FIG. 12 shows the timing distribution of events recorded over several days, using a single-channel analyzer on pulses from one of the NaI(Tl) detectors to trigger measurements of the delay time on pulses from the avalanche photodiode arrays coupled to the sapphire window of the pressure cell. Data was sparse due to the small S-MOF bed volume and very low branching ratio, resulting in an expected event rate of ~20/day, close to the observed rate. The estimated decay time is in excellent agreement with that of the emissive state.

In other cases, in-line chemical sensors could provide multi-axis signatures. For example, real time fluorescence or absorption spectroscopy could be done through similar optical cells in line with the radioisotope detection. As with the isotope detection, sorbents with high specificity can be used in these cells.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:
1. An apparatus for analyte detection comprising:
    a pressure cell including a sorbent, the sorbent comprising a metal-organic-framework (MOF) material;
    a pump coupled to the pressure cell configured to pressurize the sorbent with a fluid containing an analyte;

a sensor configured for detection of the analyte in the sorbent by detecting gamma, beta, or gamma and beta particles; and a computing device configured to process data received from the sensor and compile multiple sensed properties to produce a signature set of data for the analyte.

2. The apparatus of claim 1, wherein the sensor comprises a photodetector.

3. The apparatus of claim 1, wherein the MOF material has a selectivity of >2 for noble gases over other atmospheric components.

4. The apparatus of claim 1, wherein apparatus comprises a micro-electromechanical (MEMS) sensor coated with a MOF thin film.

5. The apparatus of claim 1, further comprising a second sensor, and wherein the computing device is configured to process data received from the sensor and the second sensor and contemporaneously process the data to produce a signature set of data for the analyte.

6. The apparatus of claim 5, further comprising data storage wherein the computing device is configured to match the signature set of data of the analyte to a signature in the data storage.

7. The apparatus of claim 1, wherein the MOF material is a scintillating MOF.

8. The apparatus of claim 1, wherein the MOF material comprises one or more of UiO-67, IRMOF-8, IRMOF-8 (interpenetrated), IRMOE-9, IRMOF-10, IRMOE-IRMOE-16, or DUT-6.

9. The apparatus of claim 1, wherein the MOF material has a light transmittance of 90 to 100%.

10. A method for detecting an analyte in a fluid sample, the steps of which comprise:

loading a sorbent with a sample fluid, wherein the sorbent comprises a MOF material;

pressurizing the sample fluid to increase the sample fluid in the sorbent thereby making a pressurized sorbent; and detecting more than one of ionizing radiation or a chemical property of the analyte in the pressurized sorbent.

11. The method of claim 10, further comprising contemporaneously processing data from signals received from the pressurized sorbent.

12. The method of claim 10, further comprising:

detecting a combination of properties of the analyte in the sorbent, processing data relevant to the detected combination of properties; and searching for the combination of properties among multiple data signatures of known analytes stored in data storage having the same combination of properties.

13. The method of claim 10, further comprising exhausting fluid from the sorbent and repressurizing the sample fluid into the sorbent and detecting ionizing radiation or chemical properties of the analyte during a predefined time window in the pressurized sorbent.

14. The method of claim 10, further comprising processing data relevant to a detected ionizing radiation or a detected chemical property of the analyte, to produce $\beta$ counts above background, coincident $\gamma$ energy, timing distribution, a continuous integrated signal, or combinations thereof.

15. The method of claim 10, wherein the analyte is a noble gas radioisotope.

16. The method of claim 10, wherein the sample fluid is pressurized to 1.3 to 350 bar.

17. The method of claim 10, wherein the fluid pressure in the sorbent is maintained by contemporaneously pressurizing the fluid and exhausting fluid from the sorbent during the detecting step.

18. The method of claim 10, wherein the MOF material comprises one or more of UiO-67, IRMOF-8, IRMOF-8 (interpenetrated), IRMOF-9, IRMOF-10, IRMOF-IRMOF-16, DUT-6, or UiO-66.

19. The method of claim 10, wherein the MOF material has a selectivity of >2 for noble gases over other atmospheric components.

20. The method of claim 10, wherein the fluid is air from an environment around the sorbent.

* * * * *